(12) United States Patent
Ahn et al.

(10) Patent No.: US 9,052,599 B2
(45) Date of Patent: Jun. 9, 2015

(54) MASKLESS EXPOSURE APPARATUS AND METHOD

(75) Inventors: Sung Min Ahn, Seoul (KR); Sang Don Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1274 days.

(21) Appl. No.: 12/923,922

(22) Filed: Oct. 14, 2010

(65) Prior Publication Data

US 2011/0116064 A1 May 19, 2011

(30) Foreign Application Priority Data

Nov. 16, 2009 (KR) ........................ 10-2009-0110437

(51) Int. Cl.
| | |
|---|---|
| *G01B 11/00* | (2006.01) |
| *G03B 27/32* | (2006.01) |
| *G03B 27/54* | (2006.01) |
| *H02K 41/02* | (2006.01) |
| *G03F 7/20* | (2006.01) |
| *G03F 9/00* | (2006.01) |

(52) U.S. Cl.
CPC .......... *G03F 7/2057* (2013.01); *G03F 7/70291* (2013.01); *G03F 7/70633* (2013.01); *G03F 9/7015* (2013.01); *G03F 9/7003* (2013.01); *G03F 7/70666* (2013.01); *G03F 9/7019* (2013.01)

(58) Field of Classification Search
CPC ... G03B 27/42; G03F 7/2057; G03F 7/70275; G03F 7/70283; G03F 7/70291; G03F 7/70633; G03F 7/70666; G03F 9/70; G03F 9/7003; G03F 9/7007; G03F 9/7015; G03F 9/7019; G03F 2009/005

USPC ............ 310/12.06, 12.19; 355/53, 67, 72, 77; 356/399–401, 614–616, 622

See application file for complete search history.

(56) References Cited

U.S. PATENT DOCUMENTS

| | | | |
|---|---|---|---|
| 2006/0279717 A1* | 12/2006 | Hirano | 355/53 |
| 2008/0221709 A1* | 9/2008 | Ishii et al. | 700/30 |
| 2009/0213357 A1* | 8/2009 | Arai | 355/72 |
| 2010/0208229 A1* | 8/2010 | Shin et al. | 355/77 |

FOREIGN PATENT DOCUMENTS

WO   WO 2009008605 A2 *  1/2009 ................ G03F 7/20

* cited by examiner

*Primary Examiner* — Colin Kreutzer

(74) *Attorney, Agent, or Firm* — Harness, Dickey & Pierce, P.L.C.

(57) ABSTRACT

Example embodiments are directed to a maskless exposure apparatus using off-axis alignment to form a virtual mask pattern on a substrate. The maskless exposure apparatus includes a movement unit on which the substrate is placed, a light source unit configured to output light, a projection unit configured to divide the light output from the light source unit into a plurality of spot beams to form the pattern and configured to project the spot beams to the movement unit, an alignment unit configured to output alignment light to align the substrate and a virtual mask, a beam imaging unit configured to capture the spot beams and the alignment light, and a controller configured to measure distances between the captured alignment light and at least two of the captured spot beams and configured to determine alignment between the virtual mask and the substrate based on the measured distances to control movement of the movement unit.

18 Claims, 7 Drawing Sheets

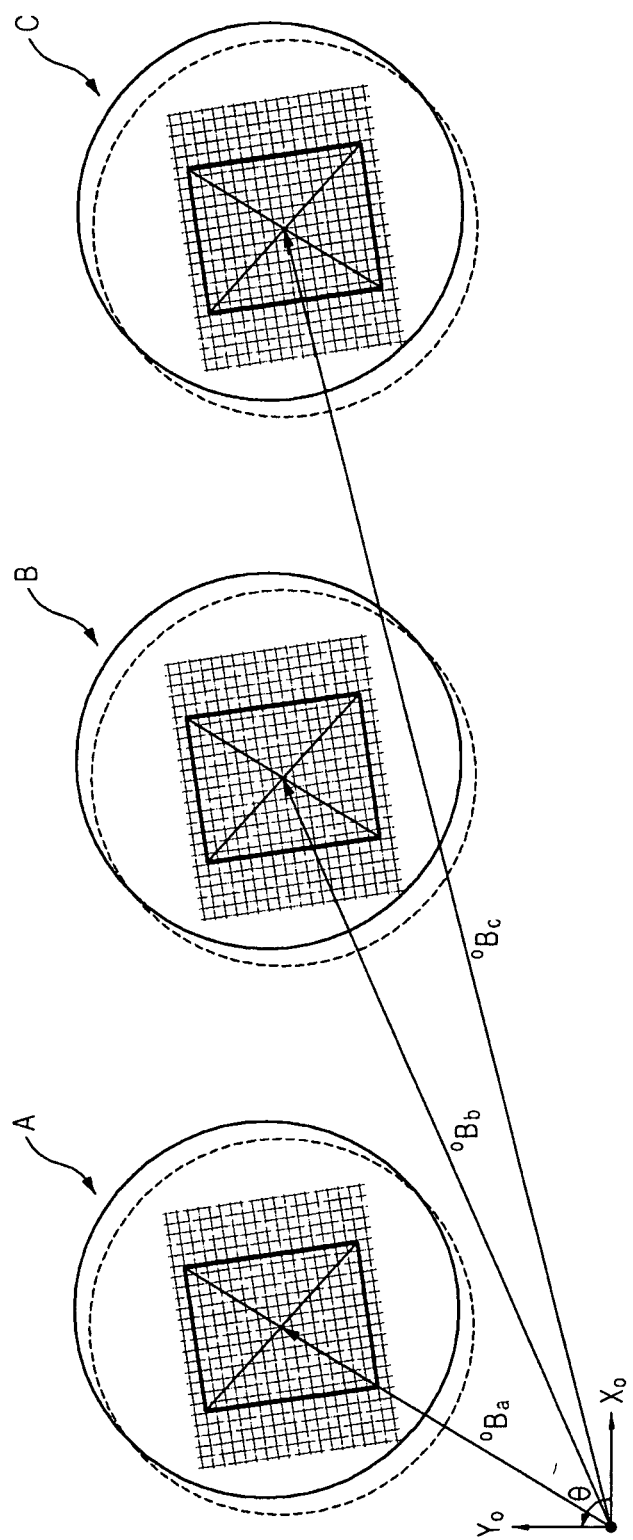

MASKLESS EXPOSURE APPARATUS AND METHOD

CROSS-REFERENCE TO RELATED APPLICATION

This application claims priority under 35 U.S.C. §119 to Korean Patent Application No. 2009-0110437, filed on Nov. 16, 2009 in the Korean Intellectual Property Office, the entire disclosure of which is incorporated herein by reference.

BACKGROUND

1. Field

Example embodiments relate to a maskless exposure apparatus and a method, and particularly to a maskless exposure apparatus and a method of using off-axis alignment to align a virtual mask and a substrate prior to exposure.

2. Description of the Related Art

Research and development is currently under way in the semiconductor industry to improve operation performance of various digital devices used in the industry, for example. As a result, a greater improvement in semiconductor device performance is achieved. For example, an exposure process to substantially reduce a line width of a circuit that is formed on the semiconductor is under development.

With the advancement of the information age, a flat panel display (FPD), such as a liquid crystal display (LCD), a plasma display panel (PDP), or electroluminescent display (ELD), exhibiting low power consumption has been developed. The size of the flat panel display has been increased based in part due to consumer demands, resulting in a development of overall process based equipment and methods. In particular, in a manufacturing process of the flat panel display, an exposure process to form a pattern on a display panel has been intensively developed.

That is, the exposure process is of relatively greater importance in the semiconductor and/or flat panel display field.

In the exposure process, light from a light source may be transmitted through a pattern of a photo mask, the light may be focused on a substrate, and exposure may be performed. In this mask type exposure process, however, high-resolution exposure may not be achieved due to the increase in manufacturing costs and management costs during exposure of a high-resolution micro circuit pattern.

For this reason, a maskless exposure process to achieve a line width of a super micro circuit is used.

In the maskless exposure process, light output from a light source is irradiated on a photosensitive film on a substrate according to a virtual mask pattern such that the photosensitive film is exposed in the form of a virtual mask pattern.

In the maskless exposure process, alignment between the virtual mask and the substrate (or wafer) is performed before exposure. At this time, when the alignment between the virtual mask and the substrate (or wafer) is performed using off-axis alignment, a baseline between an optical axis of pattern forming light and an optical axis of alignment light may drift.

Also, in a case in which a plurality of layers are exposed on a single substrate, alignment between each virtual mask and the substrate (or wafer) may be performed whenever each layer is disposed on the substrate. Also, the pattern forming light may be thermally deformed by external environmental changes, such as the increase of heat from a light source, due to the increase of processing time caused by the increase in number of layer disposition and exposure processes, with the result that the baseline between the optical axis of the pattern forming light and the optical axis of the alignment light may drift. A baseline drift amount resulting from the drift of the baseline causes an alignment error between the pattern forming light and the alignment light, thereby increasing an overlay error between layers.

SUMMARY

According to example embodiments, a maskless exposure apparatus that forms a virtual mask pattern on a substrate, includes a movement unit on which the substrate is placed; a light source unit configured to output light; a projection unit configured to divide the light output from the light source unit into a plurality of spot beams to form the virtual mask pattern and to project the spot beams on the movement unit; an alignment unit configured to output alignment light to align the substrate and a virtual mask; a beam imaging unit configured to capture the spot beams and the alignment light; and a controller configured to measure distances between the captured alignment light and at least two of the captured spot beams and configured to determine alignment between the virtual mask and the substrate based on the measured distances and control a movement of the movement unit.

According to example embodiments, the controller sets the distances between the captured alignment light and the at least two captured spot beams as a baseline distance.

According to example embodiments, the controller creates a vector $°b_{ij}'$ of the distances between the alignment light and the at least two spot beams and sets the baseline $°B_{ij}'$ using the created vector $°b_{ij}'$ satisfying the condition $$°B_i' = \frac{1}{MN}\sum_{j=1}^{MN} °b_{ij}'$$

where, MN is M×N, which is the sampling number of spot beams, and j is a position of each of the spot beams.

According to example embodiments, a distance between the alignment light and a standard spot beam is stored in advance as a standard baseline $°Bi_j$, and the controller compares the set baseline $°B_{ij}'$ with the standard baseline $°Bi_j$ to estimate an average positional drift amount of the set baseline.

According to example embodiments, the virtual mask includes a target mark, a position of the target mark being stored in advance, and the controller calculates a transfer amount of the target mark based on the position of the target mark and an average positional drift amount of the spot beams.

According to example embodiments, distances between the beam imaging unit and at least two standard spot beams are set in advance as a standard baseline, and a vector $°r_{ij}$ of the standard baseline is stored in advance, and the controller sets a temporary baseline using two spot beams projected by the beam imaging unit, creates a vector $°r_{ij}'$ of the temporary baseline, compares the vector $°r_{ij}'$ of the temporary baseline with the vector $°r_{ij}$ of the standard baseline to calculate a drift amount of the temporary baseline, and calculates a drift amount of the set baseline based on to the calculated drift amount of the temporary baseline.

According to example embodiments, the substrate includes a plurality of regions, the projection unit includes a plurality of projection units configured to project virtual masks on the regions of the substrate, and the controller configured to set distances between the alignment light and the spot beams of the projected pattern forming light as multiple baselines.

According to example embodiments, distances between the alignment unit and at least two standard spot beams are set in advance as a standard baseline, and a position $$^{o}b_{ij} = \begin{bmatrix} X_{ij} \\ Y_{ij} \end{bmatrix}$$

of the standard baseline is stored in advance, and the controller calculates a drift position $$^{o}b'_{ij} = \begin{bmatrix} X'_{ij} \\ Y'_{ij} \end{bmatrix}$$

of the baseline, estimates translation (Tx, Ty), rotation (Rx, Ty), and magnification (Mx, My) coefficients using a multiple regression method satisfying the conditions $$\begin{bmatrix} T_X \\ M_X \\ -R_X \end{bmatrix} = \overline{\beta_x} = (U^T U)^{-1} U^T x', \begin{bmatrix} T_Y \\ M_Y \\ R_Y \end{bmatrix} = \overline{\beta_y} = (U^T U)^{-1} U^T y',$$

and calculates a drift amount of the baseline using the estimated translation, rotation, and magnification coefficients.

According to example embodiments, the virtual mask includes at least one target mark, a position of the target mark being stored in advance, and the controller calculates a transfer amount of the target mark based on the position of the target mark and the drift amount of the baseline.

According to example embodiments, the controller sets the distances between the captured alignment light and the at least two captured spot beams as a baseline, calculates a drift amount of the baseline, and controls movement of the movement unit based on the calculated drift amount to compensate for the drift amount.

According to example embodiments, when a plurality of layers on the substrate are exposed, the controller calculates and stores a drift amount of an interlayer baseline before exposure, and when a succeeding exposure is performed, the controller controls movement of the movement unit based on the drift amount of the baseline for each layer on the substrate and controls the exposure to be performed.

According to example embodiments, the maskless exposure apparatus, further includes a light adjustment unit configured to adjust the spot beams projected by the projection unit, wherein when the virtual mask and the substrate are misaligned, the controller calculates a drift amount of the baseline and controls light adjustment of the light adjustment unit based on the calculated drift amount.

According to example embodiments, a maskless exposure method of forming a virtual mask pattern on a substrate, includes dividing light output from a light source unit into a plurality of spot beams to form the virtual mask pattern and projecting the spot beams on the substrate; outputting alignment light to align the substrate and a virtual mask; capturing the alignment light and the spot beams projected to the substrate; and measuring distances between the alignment light and at least two of the spot beams based on the captured image to determine alignment between the virtual mask and the substrate and controlling movement of the substrate based on the determined alignment.

According to example embodiments, the maskless exposure method, further includes setting the distances between the alignment light and the spot beams as a baseline.

According to example embodiments, setting the distances between the alignment light and the spot beams as the baseline includes creating a vector $^{o}b_{ij}'$ of the distances between the alignment light and the spot beams and setting the baseline $^{o}B_{ij}'$ using the created vector $^{o}b_{ij}'$ satisfying the condition $$^{o}B'_i = \frac{1}{MN} \sum_{j=1}^{MN} {}^{o}b'_{ij},$$

where, MN is M×N, which is the sampling number of spot beams, and j is a position of each of the spot beams.

According to example embodiments, the maskless exposure method, further includes comparing the set baseline $^{o}B_{ij}'$ with a standard baseline $^{o}B_{ij}$ to compensate for an average positional drift amount of the set baseline.

According to example embodiments, determining the alignment between the virtual mask and the substrate includes: storing in advance a position of a target mark included in the virtual mask; calculating a transfer amount of the target mark based on the position of the target mark and an average positional drift amount of the spot beams; and compensating for a position of the substrate based on the transfer amount of the drift target mark when determining the alignment.

According to example embodiments, the maskless exposure method, further including: setting distances between a beam imaging position and at least two spot beams as a temporary baseline; creating a vector $^{o}r_{ij}'$ of the temporary baseline; comparing the vector $^{o}r_{ij}'$ of the temporary baseline with a vector $^{o}r_{ij}$ of a standard baseline to calculate a drift amount of the temporary baseline; and calculating a drift amount of the set baseline based on the calculated drift amount of the temporary baseline.

According to example embodiments, the maskless exposure method, further includes setting in advance distances between the alignment unit and at least two standard spot beams as a standard baseline and storing in advance a position $$^{o}b_{ij} = \begin{bmatrix} X_{ij} \\ Y_{ij} \end{bmatrix}$$

of the standard baseline; calculating a drift position $$^{o}b'_{ij} = \begin{bmatrix} X'_{ij} \\ Y'_{ij} \end{bmatrix}$$

of the baseline; estimating translation (Tx, Ty), rotation (Rx, Ty), and magnification (Mx, My) coefficients using a multiple regression method satisfying the conditions $$\begin{bmatrix} T_X \\ M_X \\ -R_X \end{bmatrix} = \overline{\beta_x} = (U^T U)^{-1} U^T x', \begin{bmatrix} T_Y \\ M_Y \\ R_Y \end{bmatrix} = \overline{\beta_y} = (U^T U)^{-1} U^T y';$$

and calculating a drift amount of the baseline using the estimated translation, rotation, and magnification coefficients.

According to example embodiments, determining alignment between the substrate and the virtual mask includes storing in advance a position of a target mark included in the virtual mask; calculating a transfer amount of the target mark based on the position of the target mark and drift amount of the baseline; and compensating for a position of the substrate based on the transfer amount of the drift target mark when determining the alignment.

According to example embodiments, determining alignment between the substrate and the virtual mask includes calculating a drift amount of the baseline and controlling the movement of the substrate based on the calculated drift amount after determining that the virtual mask and the substrate are misaligned.

According to example embodiments, calculating the drift amount of the baseline includes when a plurality of layers are exposed on the substrate, storing a drift amount of an interlayer baseline before exposure; and when a succeeding exposure is performed, controlling a movement of the substrate based on the drift amount of the baseline for each layer on the substrate.

According to example embodiments, the maskless exposure method, further includes: adjusting light projected on the substrate based on the calculated drift amount after determining that the virtual mask and the substrate are misaligned.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 7 illustrates a definition of a baseline in the maskless exposure apparatus of FIG. 6.

DETAILED DESCRIPTION

Figure 1:
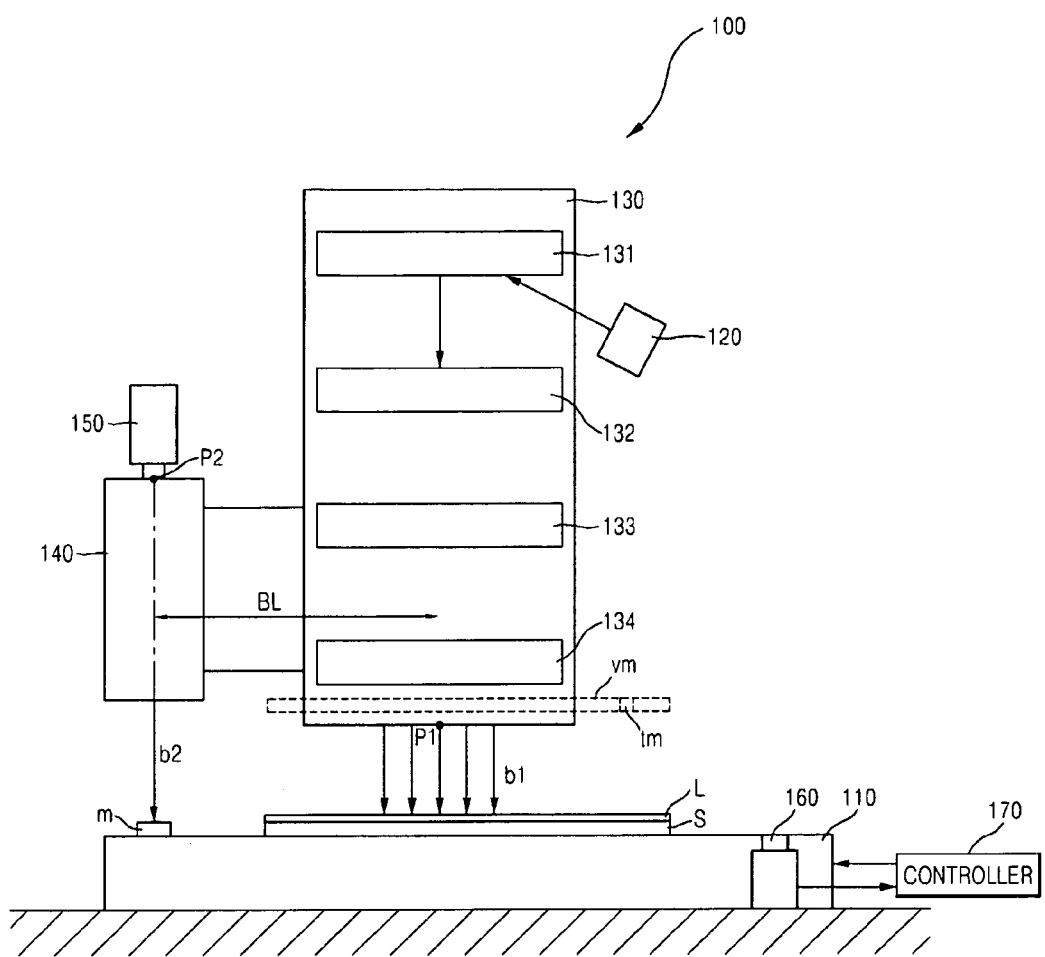
FIG. 1 illustrates a maskless exposure apparatus using off-axis alignment according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a maskless exposure apparatus using off-axis alignment according to example embodiments.

A maskless exposure apparatus using off-axis alignment is an apparatus that aligns a virtual mask vm and a substrate s using off-axis alignment and forms a virtual mask pattern on the substrate s through scanning and/or stepping. A maskless exposure apparatus 100 that aligns a virtual mask vm and a substrate s includes a movement unit 110, a light source unit 120, a projection unit 130, an alignment unit 140, a mark imaging unit 150, a beam imaging unit 160, and/or a controller 170.

The movement unit 110 is a stage to support a substrate (wafer or glass) s to be exposed. During alignment between the virtual mask vm and the substrate s before exposure, the movement unit 110 is moved according to a command from the controller 170 to accurately align the virtual mask vm and the substrate s. A layer L, which is an exposure layer, is formed on the substrate s. The layer L forms a pattern on the substrate s through an exposure process.

The light source unit 120 outputs laser light, for example. The laser light is output to the substrate s on the movement unit 110 through the projection unit 130.

The projection unit 130 is at one side of the movement unit 110 to project pattern forming light constituted by a plurality of spot beams to form a virtual mask pattern on the substrate s.

The projection unit 130 includes a spatial light modulator (SLM) 131 to reflect the light output from the light source unit 120 into light to form a virtual mask pattern, a first projection lens 132 to magnify the light reflected by the spatial light modulator 131, a multi-lens array (MLA) 133 including a plurality of lenses to divide the light, having the virtual mask pattern, magnified by the first projection lens 132 into a plurality of spot beams and to condense the spot beams, and a second projection lens 134 to adjust resolutions of the spot beams condensed by the multi-lens array 133 and transmit the spot beams.

The projection unit 130 creates a virtual mask vm having a pattern formed by the spot beams transmitted through the second projection lens 140.

The virtual mask vm, which is not a physical mask, is created by turning on or off the spot beams in correspondence to a previously stored pattern at the spatial light modulator to form a pattern. The virtual mask vm has a patterning size that is formed on the substrate.

In the maskless exposure apparatus with the above-stated construction, light is output from the light source unit 120, and the light output from the light source unit 120 is reflected into light having a virtual mask pattern by the spatial light modulator 131. The light having the virtual mask pattern reflected by the spatial light modulator 131 is magnified by the first projection lens 132. The magnified light having the virtual mask pattern is divided into a plurality of spot beams, and the spot beams are condensed, by the multi-lens array 133. The second projection lens 134 adjusts resolutions of the spot beams condensed by the multi-lens array 133 and transmits the spot beams to perform exposure.

More specifically, the spatial light modulator 131 selectively reflects light output from the light source unit 120 according to a previously stored pattern. A virtual mask pattern is created by the reflected light. In the maskless exposure apparatus 100, therefore, a pattern is created by the spatial light modulator 131 using light without a mask to perform exposure.

A digital micromirror device (DMD) may be used as the spatial light modulator 131. The digital micromirror device includes a plurality of micromirrors that may be set to predetermined/desired angles to selectively reflect light output from the light source unit 120, i.e., to emit incident light at a desired angle and other light at different angles. Consequently, the micromirrors are driven to reflect some of the light output from the light source unit 120 in the form of the virtual mask pattern to output light to form a pattern.

The projection unit 130 has an optical axis P1 which is the optical center of light b1 projected to the substrate s to form a pattern.

The alignment unit 140 is provided at one side of the projection unit 130 to perform overlay alignment.

The alignment unit 140 includes a light source (not shown). The light source of the alignment unit 140 outputs light that is projected on the movement unit 110 and/or the substrate s such that the optical axis of the alignment unit 140 is indicated on the movement unit 110 or the substrate s. That is, the alignment unit 140 has an optical axis P2 which is the optical center of light b2 projected on the substrate s to perform accurate alignment between the virtual mask vm and the substrate s.

The distance between the optical axis P1 of the pattern forming light and the optical axis P2 of the alignment light is referred to as a baseline BL to perform overlay alignment.

The mark imaging unit 150 is provided above the alignment unit 140 to capture an alignment mark m provided on the movement unit 110 to accurately align the virtual mask vm and the substrate s, thereby facilitating accurate transfer of the captured image to the controller 170. The movement of the movement unit 110 is controlled according to a command from the controller 170 until the alignment mark m is captured by the mark imaging unit 150.

The beam imaging unit 160 is provided at one side of the movement unit 110 to capture a plurality of spot beams of the pattern forming light projected by the projection unit 130. The beam imaging unit 160 transmits the captured image to the controller 170 such that positional coordinates of the spot beams having the virtual mask pattern are acquired by the controller 170.

The controller 170 defines the baseline, i.e., the distance between the optical axis P1 of the pattern forming light and the optical axis P2 of the alignment light, based on the image transmitted from the mark imaging unit 150 and the beam imaging unit 160 and determines whether the alignment between the virtual mask vm and the substrate s has been accurately performed. When it is determined that the alignment between the virtual mask vm and the substrate s has not been accurately performed, the controller 170 calculates a baseline drift amount, controls the movement of the movement unit 110 based on the calculated baseline drift amount, and controls exposure to be performed.

In other words, the controller 170 controls the movement of the movement unit 110 based on the calculated baseline drift amount to accurately align the virtual mask vm and the substrate s.

Hereinafter, a description will be given of a method of calculating a baseline drift amount when the alignment between the virtual mask vm and the substrate s is not accurately performed due to drift of the baseline BL, i.e., the distance between the distance between the optical axis P1 of the pattern forming light and the optical axis P2 of the alignment light. Herein, for sake of convenience, only a translation coefficient is considered to calculate the baseline drift amount.

Figure 2:
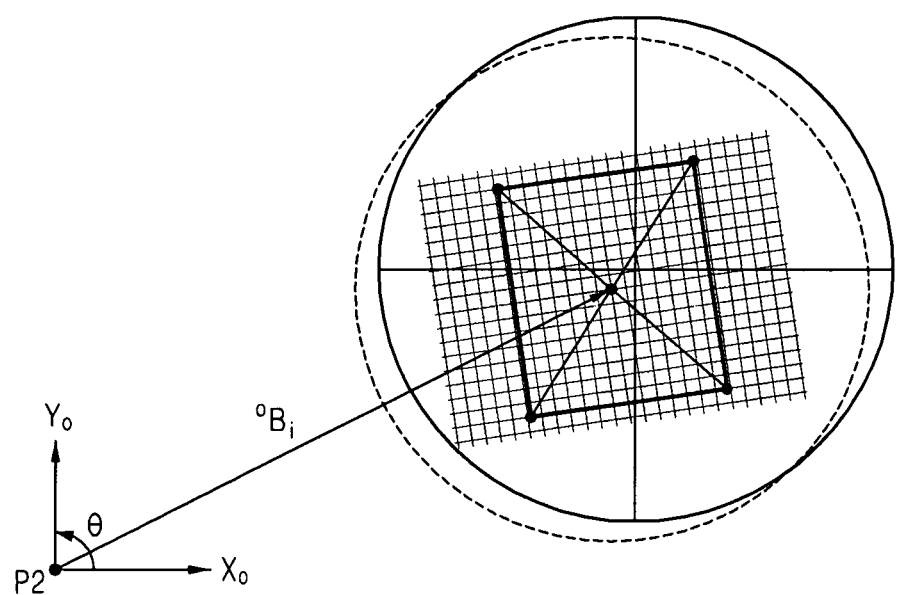
FIG. 2 illustrates a definition of a baseline in the maskless exposure apparatus of FIG. 1.

FIG. 2 is a view illustrating a definition of the baseline in the maskless exposure apparatus of FIG. 1.

Figure 3:
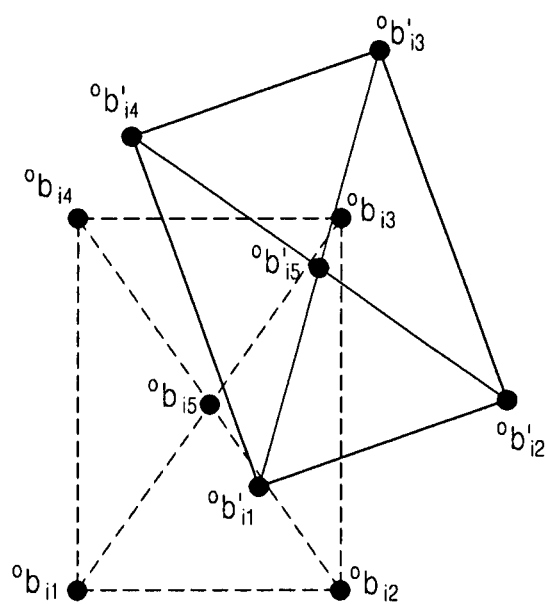
FIG. 3 illustrates a standard virtual mask obtained by a beam imaging unit of the maskless exposure apparatus of FIG. 1 and a projected virtual mask.

It is confirmed whether the alignment mark m is present in the image captured by the mark imaging unit 150. When the alignment mark m is present in the captured image, it is determined whether the alignment between the virtual mask vm and the substrate s has been accurately performed based on the image captured by the beam imaging unit 160. As shown in FIG. 3, positions $°b'_{i1}$ to $°b'_{i5}$ of the spot beams of the pattern forming light are acquired from the image captured by the beam imaging unit 160. Alternatively, the center of gravity of the spot beams of the pattern forming light may be further acquired when the positions of the spot beams projected to the substrate s are acquired.

It may be understood that the positional coordinates of the spot beams of the pattern forming light projected by the projection unit 130 do not coincide with the positional coordinates of standard spot beams. That is, it is understood that the alignment between the virtual mask and the substrate has not been accurately performed due to positional change of the spot beams to form the pattern.

Alternatively, the distance from the alignment light to the positions of the spot beams may be defined as a baseline based on the image captured by the beam imaging unit 160, and the standard baseline, for example, the distance from the alignment light to positions $°b_{i1}$ to $°b_{i5}$ of predetermined standard spot beams, and the defined baseline may be compared to determine whether the alignment between the virtual mask vm and the substrate s has been accurately performed.

The positions of the standard spot beams and the standard baseline based thereon are set in advance, and the center of gravity of the standard spot beams and the center baseline based thereon are also set in advance.

The positions of the standard spot beams may be acquired during the alignment between the virtual mask and the substrate upon the first exposure or may be set in advance as positions where an optimum exposure process is performed during manufacture of the maskless exposure apparatus.

The number of spot beams necessary for sampling to define the baseline is optimized in consideration of throughput and accuracy of an estimation coefficient to calculate a baseline drift amount.

A definition of the baseline will be described in more detail with reference to FIG. 2.

The distance from the position of alignment light to the center of gravity of a plurality of spot beams of pattern forming light (i.e., the optical axis of the pattern forming light) projected by the projection unit 130 is defined as a baseline $°B_i'$, which is a center baseline among a plurality of baselines.

In addition, the distance from the position of the alignment light to the center of gravity of a plurality of standard spot beams is set in advance as a standard baseline $°B_i$.

$$°B_i = \frac{1}{MN} \sum_{j=1}^{MN} °b_{ij}, \quad °B_i' = \frac{1}{MN} \sum_{j=1}^{MN} °b_{ij}' \quad \text{(Equation 1)}$$

where, MN is M×N, which is the sampling number of spot beams necessary to define a baseline, i is a sampling sequence of the MN spot beams at an $i^{th}$ projection unit when a plurality of projection units 130 are provided, and O is a baseline measured at an $O^{th}$ alignment unit when a plurality of alignment units are provided.

Subsequently, the standard baseline and the defined baseline are compared to determine a baseline drift amount.

That is, a vector $°b_{ij}$ of at least two standard baselines and a vector $°b_{ij}'$ of at least two defined baselines are compared, respectively, to calculate a baseline drift amount $\Delta b_{ij}$.

A drift amount of the baseline, i.e., the distance from the position of the alignment light to the position of the spot beams, may be calculated. However, spot beams projected through the projection unit 130 may not be captured by the mark imaging unit 150. For this reason, the baseline from the alignment light as a standard may not be captured, with the result that the baseline drift amount $\Delta b_{ij}$ may not be directly calculated.

Consequently, the pattern forming light and the alignment light are captured by the beam imaging unit 160, and a temporary baseline from the beam imaging unit 160 to the pattern forming light is defined based on an optical center P3 of the beam imaging unit 160 having a fixed position. A drift amount $\Delta r_{ij}$ of the temporary baseline is calculated, and a baseline drift amount $\Delta b_{ij}$ is calculated using the calculated drift amount $\Delta r_{ij}$.

Figure 4:
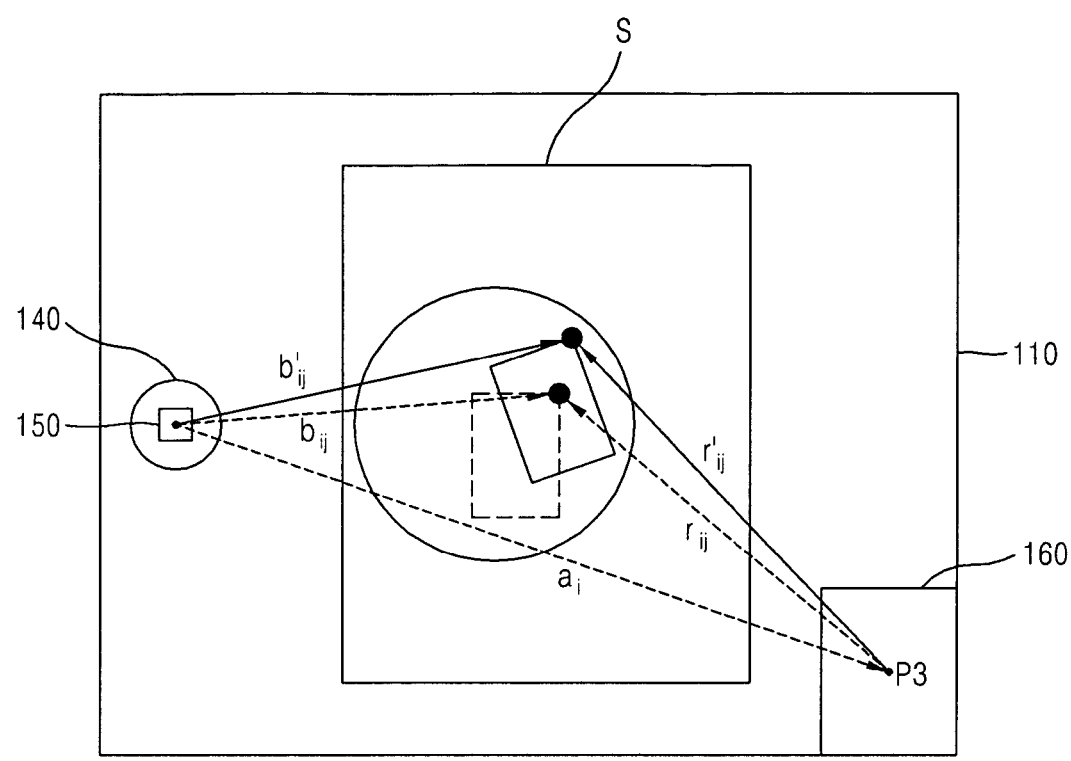
FIG. 4 illustrates calculation of a baseline drift amount in the maskless exposure apparatus of FIG. 1.

FIG. 4 illustrates calculation of a baseline drift amount in the maskless exposure apparatus of FIG. 1.

As shown in FIG. 4, a relationship between a vector $b_{ij}$ from the alignment light to the position of a $j^{th}$ spot beam of the standard spot beams and a vector $r_{ij}$ from the beam imaging unit 160 to the position of the $j^{th}$ spot beam of the standard spot beams is represented by Equation 2.

Also, a relationship between a vector $b_{ij}'$ from the alignment light to the position of a $j^{th}$ spot beam of the spot beams of the pattern forming light and a vector $r_{ij}'$ from the beam imaging unit 160 to the position of the $j^{th}$ spot beam of the spot beams of the pattern forming light is represented by Equation 2.

$$b_{ij} = a_i + r_{ij}, \quad b_{ij}' = a_i + r_{ij}' \quad \text{(Equation 2)}$$

Where, $a_i$ is the distance between the optical axis of the alignment light and the optical center P3 of the beam imaging unit 160, which is uniform (for example, constant even when the baseline drifts depending upon the drift of the pattern forming light. Consequently, Equation 3 is satisfied.

$$b_{ij}' - b_{ij} = r_{ij}' - r_{ij}, \Delta b_{ij} = \Delta r_{ij} (\because a_i = \text{const}) \quad \text{(Equation 3)}$$

It is understood from Equation 3 that a drift amount $\Delta r_{ij}$ of the temporary baseline is calculated, and a baseline drift amount $\Delta b_{ij}$ is calculated using the calculated drift amount $\Delta r_{ij}$.

In addition, the baseline drift amount may be estimated depending upon an average position drift amount of the baseline as represented by Equation 4 based on Equation 1.

$$\text{Average position drift amount} = °B_i' - °B_i \quad \text{(Equation 4)}$$

In this way, a baseline is defined based on the positional coordinates of the spot beams of the pattern forming light projected by the projection unit 130, and a drift amount of the defined baseline is periodically calculated and stored. The calculated baseline drift amount is compensated for during alignment between the substrate and the virtual mask, and exposure is performed, thereby improving exposure accuracy.

A description of method, according to example embodiments, of calculating a baseline drift amount when the alignment between the virtual mask vm and the substrate s is not accurately performed due to drift of the baseline BL follows. Here, translation (Tx, Ty), rotation (Rx, Ty), and magnification (Mx, My) coefficients are considered to calculate the baseline drift amount, and a multiple regression method (for example, least squares) to which these coefficients are applied is used. Here, these coefficients are estimation regression coefficients to be estimated using the multiple regression method.

First, $°b_{ij}$ is the standard position of a $j^{th}$ spot beam projected by an $i^{th}$ projection unit, and $°b_{ij}'$ is the drift position of the $j^{th}$ spot beam. $°b_{ij}$ and $°b_{ij}'$ are represented by Equation 5.

$$°b_{ij} = \begin{bmatrix} X_{ij} \\ Y_{ij} \end{bmatrix}, \quad °b_{ij}' = \begin{bmatrix} X_{ij}' \\ Y_{ij}' \end{bmatrix} \quad \text{(Equation 5)}$$

Mathematical modeling is performed with respect to the respective coefficients to calculate the drift position, i.e., the position $(X_{ij}', Y_{ij}')$ of $b_{ij}'$. Here, the position $(X_{ij}', Y_{ij}')$ of $b_{ij}'$ has positional coordinates calculated by the beam imaging unit 160, and the position $(X_{ij}, Y_{ij})$ of $b_{ij}$ are positional coordinates set in advance.

On the assumption that the $j^{th}$ spot beam to be sampled is 5, a translation (Tx, Ty), rotation (Rx, Ty), and magnification (Mx, My) matrix equation of $X_{ij}', Y_{ij}'$ is represented by Equation 6.

$$\begin{bmatrix} X'_{i1} \\ X'_{i2} \\ X'_{i3} \\ X'_{i4} \\ X'_{i5} \end{bmatrix} = \begin{bmatrix} 1 & X_{i1} & Y_{i1} \\ 1 & X_{i2} & Y_{i2} \\ 1 & X_{i3} & Y_{i3} \\ 1 & X_{i6} & Y_{i4} \\ 1 & X_{i5} & Y_{i5} \end{bmatrix} \cdot \begin{bmatrix} T_X \\ M_X \\ -R_X \end{bmatrix},$$ (Equation 6)

$$\begin{bmatrix} Y'_{i1} \\ Y'_{i2} \\ Y'_{i3} \\ Y'_{i4} \\ Y'_{i5} \end{bmatrix} = \begin{bmatrix} 1 & X_{i1} & Y_{i1} \\ 1 & X_{i2} & Y_{i2} \\ 1 & X_{i3} & Y_{i3} \\ 1 & X_{i6} & Y_{i4} \\ 1 & X_{i5} & Y_{i5} \end{bmatrix} \cdot \begin{bmatrix} T_Y \\ R_Y \\ M_Y \end{bmatrix},$$

Equation 6 may be simplified as follows.

$$x'=U\beta_x, y'=U\beta_y$$ (Equation 7)

The translation, rotation, and magnification coefficients are estimated by a multiple regression method as follows.

$$\begin{bmatrix} T_X \\ M_X \\ -R_X \end{bmatrix} = \overline{\beta_x} = (U^T U)^{-1} U^T x',$$ (Equation 8)

$$\begin{bmatrix} T_Y \\ M_Y \\ R_Y \end{bmatrix} = \overline{\beta_y} = (U^T U)^{-1} U^T y'$$

$$X'_{ij} = (T_X + M_X X_{ij} - R_X Y_{ij}) + r_x(X_{ij}, Y_{ij}),$$ (Equation 9)
$$Y'_{ij} = (T_Y + M_Y X_{ij} + R_Y Y_{ij}) + r_y(X_{ij}, Y_{ij})$$

Six coefficients to be estimated may be acquired using a pseudo inverse matrix of Equation 8.

A baseline drift amount is calculated by applying the respective estimation coefficients to Equation 5.

The controller 170 controls the movement of the movement unit 110 based on the drift amount to control the alignment between the substrate s and the virtual mask vm.

In addition, when the projection unit 130 further includes a light adjustment unit (not shown) to adjust light to be projected to the substrate s, the light adjustment unit of the projection unit 130 may adjust light based on the drift amount calculated using Equation 9 to compensate for the drift amount.

In this way, the baseline may be defined based on the positional coordinates of the spot beams projected by the projection unit to form the pattern, and a drift amount of the defined baseline may be periodically calculated and stored. Also, the calculated baseline drift amount may be compensated during alignment between the substrate and the virtual mask, and exposure may be performed, thereby improving exposure performance.

Figure 5:
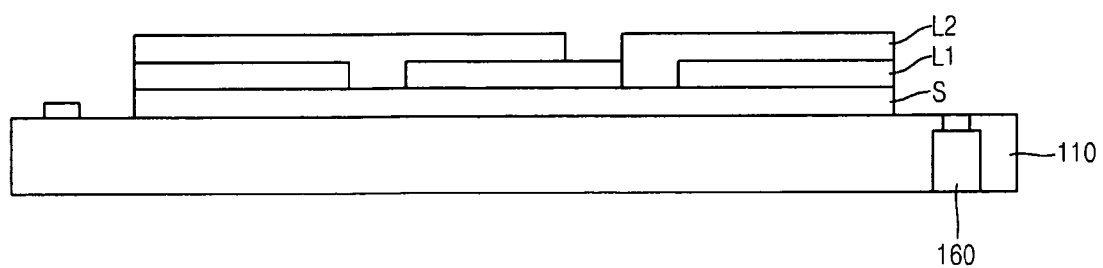
FIG. 5 illustrates a maskless exposure apparatus using off-axis alignment according to example embodiments.

FIG. 5 illustrates a maskless exposure apparatus using off-axis alignment according to example embodiments.

The maskless exposure apparatus using off-axis alignment is an apparatus that forms a pattern of a virtual mask vm on a substrate s, like the previous example embodiments. Similar to the example embodiment illustrated in FIG. 1, the maskless exposure apparatus of FIG. 5 also includes a movement unit 110, a light source unit 120, a projection unit 130, an alignment unit 140, a mark imaging unit 150, and/or a beam imaging unit 160. However, for sake of brevity, these components are not illustrated in FIG. 5.

The projection unit 130 creates a virtual mask vm having a pattern formed by a plurality of spot beams transmitted through a second projection lens 134. The virtual mask vm further has a target mark to indicate a pattern position to be exposed on the substrate s.

In the maskless exposure apparatus, a plurality of layers L1 and L2 are sequentially exposed and stacked on the substrate s.

The layers L1 and L2 have patterns formed through exposure. The layers L1 and L2 have different or the same patterns. The layers are sequentially exposed and stacked.

That is, the substrate (wafer or glass) s is placed on the movement unit 110. When the layer L1 is disposed on the substrate s, alignment between the substrate s and a virtual mask is performed, and an exposure process is performed to form a pattern on the layer L1. Subsequently, the layer L2 is disposed on the layer L1, alignment between the substrate s and another virtual mask is performed, and an exposure process is performed to form another or the same pattern on the layer L2. In this way, a plurality of layers having different or a same pattern may be stacked on a single substrate s. The pattern information input to the spatial light modulator 131 of the projection unit may be changed if different patterns are formed, for example. However, the pattern information input may remain uninterrupted if a same pattern is to be formed.

Since a plurality of exposure processes are performed, the position of the pattern forming light may be changed due to external environmental changes, for example, thermal deformation, due to increase in processing time. As a result, the baseline may drift, and therefore, an overlay error may occur between the layers.

In order to prevent this phenomenon, the alignment light and the pattern forming light are captured by the beam imaging unit 160 after disposition of the layers, the baseline according to Equation 1 is defined based on the captured image, and a baseline drift amount is calculated using Equation 2 and Equation 4.

When the layers L1 and L2 are stacked on the substrate s and overlay exposure is performed, the alignment mark m of the first layer L1 is measured by the mark imaging unit 150, and then a transfer amount to the position of the target mark tm is calculated.

According to an example method of calculating the transfer amount to the position of the target mark, the baseline drift amount at the position $^o t_{mf}$ of the standard target mark is compensated to calculate the position $^o t_{mf}{}'$ of the standard target mark.

The target mark tm is a virtual mark provided on a virtual mask vm to align the virtual mask vm and the substrate s during exposure.

$$^o t'_{mf} = {}^o t_{mf} + [{}^o B'_i - {}^o B_i]$$ (Equation 10)

Alternatively, a drift amount of the baseline defined based on Equation 5 to Equation 9 may be calculated.

When overlay exposure is performed with respect to the layers L1 and L2 on the substrate s, the alignment mark m of the first layer L1 is measured by the mark imaging unit 150, and then a transfer amount to the position of the target mark tm is calculated.

According to an example method of calculating the transfer amount to the position of the target mark, the baseline drift amount at the position $^o t_{mf}$ of the standard target mark is compensated to calculate the position $^o t_{mf}{}'$ of the standard target mark.

$$^o t'_{mf} = {^o t_{mf}} + \begin{bmatrix} T_X \\ T_Y \end{bmatrix} \quad \text{(Equation 11)}$$

Only the translation portion of baseline drift amount is applied to Equation 11.

The calculated baseline drift amount is stored, the movement of the movement unit 110 is controlled based on the calculated baseline drift amount, and exposure is performed.

This process is performed, whenever each layer is disposed and exposure is performed, to calculate and store the interlayer baseline drift amount. The stored interlayer baseline drift amount is applied to an exposure process of another substrate. Whenever each layer is disposed and exposure is performed, the movement of the movement unit 110 is controlled based on the interlayer baseline drift amount, and the exposure is performed.

In this way, the baseline may be defined based on the position of the spot beams to form the pattern, and may be compared with the position of the spot beams to form the standard pattern to easily calculate a drift amount of the defined baseline.

Also, the baseline may be defined based on the positional coordinates of the spot beams to form the pattern, and a drift amount of the defined baseline is periodically calculated and stored. The calculated baseline drift amount is compensated for during alignment between the substrate and the virtual mask, and exposure is performed, thereby improving overlay accuracy during the exposure.

Particularly when large, high-resolution LCD substrates are produced, overlay greatly affects substrate performance. Therefore, the overlay is controlled within a required specification. At this time, a baseline drift amount may be compensated for to secure overlay performance of an exposure apparatus, which is a core apparatus over all processes.

Figure 6:
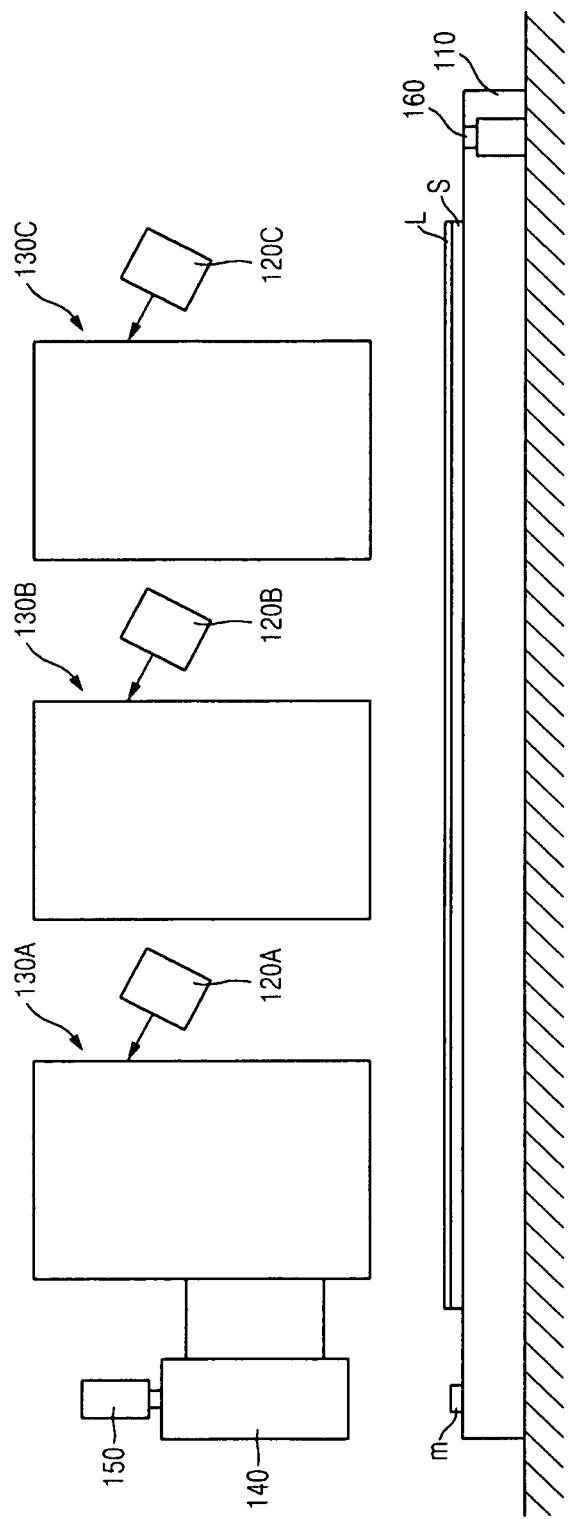
FIG. 6 illustrates a maskless exposure apparatus using off-axis alignment according to example embodiments.

FIG. 6 is a construction view of a maskless exposure apparatus according to example embodiments.

The maskless exposure apparatus using off-axis alignment according to this embodiment is an apparatus that forms patterns of a plurality of virtual masks vm on a substrate s. The maskless exposure apparatus includes a movement unit 110, a plurality of light source units 120A, 120B, and 120C, a plurality of projection units 130A, 130B, and 130C, an alignment unit 140, a mark imaging unit 150, and a beam imaging unit 160.

The movement unit 110 supports the substrate (wafer or glass) s to be exposed. During multiple alignments between the virtual masks vm and the substrate s before exposure, the movement unit 110 is moved based on a baseline drift amount to accurately align the virtual masks vm and the substrate s.

The substrate s is divided into a plurality of regions. The projection units 130A, 130B, and 130C are provided at positions corresponding to the respective regions of the substrate s. The projection units 130A, 130B, and 130C divide light output from the light source units 120A, 120B, and 120C, and project pluralities of spot beams of corresponding pattern forming lights to the respective regions of the substrate s. The operation of the projection units 130A, 130B, and 130C is similar to that of the projection unit 130 shown in FIG. 2, and therefore, a description thereof is omitted.

Each of the projection units 130A, 130B, and 130C has an optical axis P1 which is the optical center of pattern forming light projected on the substrate s.

The alignment unit 140 is provided a side of one of the projection units. As an example, the alignment unit 140 is shown at a side of the projection unit 130A. The alignment unit 140 includes a light source (not shown).

The light source of the alignment unit 140 outputs alignment light b2 to align each virtual mask and the substrate. The alignment light is projected to the movement unit 110 or the substrate s. As a result, the optical axis of the alignment light of the alignment unit 140 is indicated on the movement unit 110 or the substrate s. That is, the alignment unit 140 has an optical axis P2 which is the optical center of alignment light b2 projected to the substrate s to perform accurate alignment between each virtual mask vm and the substrate s.

The distance between the optical axis P1 of each pattern forming light and the optical axis P2 of the alignment light is defined as a baseline BL.

The mark imaging unit 150 is provided above the alignment unit 140 to capture an alignment mark m provided on the movement unit 110 to accurately align each virtual mask vm and the substrate s and to transmit the captured image to a controller 170 (not shown in FIG. 6). The movement of the movement unit 110 is controlled based on the captured image until the alignment mark m is captured by the mark imaging unit 150.

The beam imaging unit 160 is provided at one side of the movement unit 110 to capture images projected by the projection units 130A, 130B, and 130C. Also, the beam imaging unit 160 may capture light output from the light source (not shown) of the alignment unit 140. The beam imaging unit 160 transmits the captured images to the controller 170 to control the movement of the movement unit 110 such that each virtual mask vm and the substrate s are aligned with relatively high accuracy.

The controller 170 determines whether the alignment between each virtual mask vm and the substrate s has been accurately performed based on the images transmitted from the mark imaging unit 150 and the beam imaging unit 160.

FIG. 7 illustrates a definition of a baseline in the maskless exposure apparatus of FIG. 6.

Baselines $^oB_a$, $^oB_b$, and $^oB_c$, which are the distances between the pattern forming lights from the respective projection units 130A, 130B, and 130C and the alignment light projected to the respective regions A, B, and C of the substrate s, are defined based on Equation 1, baseline drift amounts defined using Equation 2 to Equation 4 are calculated, the calculated baseline drift amounts are compensated for, and exposure is performed.

In addition, baseline drift amounts defined based on Equation 5 to Equation 9 may be calculated.

The baseline drift amounts may be compensated using at least one of the baseline drift amounts, thereby achieving multiple alignments between the substrate s and the virtual masks vm.

When a plurality of layers are stacked on a single substrate, a transfer amount of a target mark may be calculated based on Equation 10 and Equation 11, and the movement of the movement unit 110 may be controlled to compensate for the transfer amount.

In addition, the alignment unit 140 and the mark imaging unit 150 are provided at a side of each of the projection units 130A, 130B, and 130C to define baselines between alignment lights of the alignment units 140 and pattern forming lights of the corresponding projection units 130A, 130B, and 130C and to calculate baseline drift amounts.

In this way, baseline drift amounts due to drift of the baselines are compensated to improve overlay accuracy of exposed substrates.

As disclosed above, in the maskless exposure method using off-axis alignment, a baseline, which is the distance (vector) between alignment light and a plurality of spot beams of pattern forming light, is defined before exposure to determine alignment between a substrate and a virtual mask.

Also, a standard baseline and the defined baseline are compared to calculate a baseline drift amount, and the calculated baseline drift amount is compensated, thereby achieving relatively accurate alignment between the virtual mask and the substrate.

The baseline drift amount is periodically calculated, and the calculated baseline drift amount is used during exposure of another substrate, thereby improving exposure performance of the substrate.

Also, when exposure processes are performed with respect to a plurality of layers on a single substrate, an interlayer baseline drift amount is calculated and stored, and the interlayer baseline drift amount is compensated during exposure of another substrate, thereby eliminating an alignment error between the substrate and each virtual mask during disposition of each layer.

That is, the interlayer baseline drift amount is compensated when the pattern forming light is deformed due to the increase of processing time caused by the increase in number of layer disposition and exposure processes; thereby preventing drift of the interlayer baseline. In addition, an alignment error between the substrate and each virtual mask during disposition of each layer is eliminated, thereby reducing an interlayer overlay error and thus improving overlay accuracy of exposed substrates.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A maskless exposure apparatus that forms a virtual mask pattern on a substrate, comprising:
   a movement unit on which the substrate is placed;
   a light source unit configured to output light;
   a projection unit configured to divide the light output from the light source unit into a plurality of spot beams to form the virtual mask pattern and to project the spot beams on the movement unit;
   an alignment unit configured to output alignment light to align the substrate and a virtual mask;
   a beam imaging unit configured to capture the spot beams and the alignment light; and
   a controller configured to measure distances between the captured alignment light and at least two of the captured spot beams and configured to determine alignment between the virtual mask and the substrate based on the measured distances and control a movement of the movement unit, wherein
   the controller sets the distances between the captured alignment light and the at least two captured spot beams as a baseline distance,
   the controller creates a vector creates a vector $^{o}b_{ij}{'}$ of the distances between the alignment light and the at least two spot beams and sets the baseline $^{o}B_{ij}{'}$ using the created vector $^{o}b_{ij}{'}$ satisfying the condition $$^{o}B_{i}{'} = \frac{1}{MN}\sum_{j=1}^{MN} {}^{o}b_{ij}{'}$$

where, MN is M×N, which is the sampling number of spot beams, and j is a position of each of the spot beams,
wherein distances between the beam imaging unit and at least two standard spot beams are set in advance as a standard baseline, and a vector $^{o}r_{ij}$ of the standard baseline is stored in advance, and
the controller sets a temporary baseline using two spot beams projected by the beam imaging unit, creates a vector $^{o}r_{ij}{'}$ of the temporary baseline, compares the vector $^{o}r_{ij}{'}$ of the temporary baseline with the vector $^{o}r_{ij}$ of the standard baseline to calculate a drift amount of the temporary baseline, and calculates a drift amount of the set baseline based on to the calculated drift amount of the temporary baseline.

2. The maskless exposure apparatus according to claim 1, wherein
a distance between the alignment light and a standard spot beam is stored in advance as a standard baseline $^{o}B_{ij}$, and
the controller compares the set baseline $^{o}B_{ij}{'}$ with the standard baseline $^{o}B_{ij}$ to estimate an average positional drift amount of the set baseline.

3. The maskless exposure apparatus according to claim 2, wherein
the virtual mask includes a target mark, a position of the target mark being stored in advance, and
the controller calculates a transfer amount of the target mark based on the position of the target mark and an average positional drift amount of the spot beams.

4. The maskless exposure apparatus according to claim 1, wherein
the substrate includes a plurality of regions,
the projection unit includes a plurality of projection units configured to project virtual masks on the regions of the substrate, and
the controller configured to set distances between the alignment light and the spot beams of the projected pattern forming light as multiple baselines.

5. The maskless exposure apparatus according to claim 1, wherein
distances between the alignment unit and at least two standard spot beams are set in advance as a standard baseline, and a position $$^{o}b_{ij} = \begin{bmatrix} X_{ij} \\ Y_{ij} \end{bmatrix}$$

of the standard baseline is stored in advance, and
the controller calculates a drift position $$^{o}b_{ij}{'} = \begin{bmatrix} X_{ij}{'} \\ Y_{ij}{'} \end{bmatrix}$$

of the baseline, estimates translation (Tx, Ty), rotation (Rx, Ty), and magnification (Mx, My) coefficients using a multiple regression method satisfying the conditions $$\begin{bmatrix} T_X \\ M_X \\ -R_X \end{bmatrix} = \overline{\beta_x} = (U^T U)^{-1} U^T x', \begin{bmatrix} T_Y \\ M_Y \\ R_Y \end{bmatrix} = \overline{\beta_y} = (U^T U)^{-1} U^T y',$$

and calculates a drift amount of the baseline using the estimated translation, rotation, and magnification coefficients.

6. The maskless exposure apparatus according to claim 5, wherein
the virtual mask includes at least one target mark, a position of the target mark being stored in advance, and
the controller calculates a transfer amount of the target mark based on the position of the target mark and the drift amount of the baseline.

7. The maskless exposure apparatus according to claim 1, wherein the controller sets the distances between the captured alignment light and the at least two captured spot beams as a baseline, calculates a drift amount of the baseline, and controls movement of the movement unit based on the calculated drift amount to compensate for the drift amount.

8. The maskless exposure apparatus according to claim 7, wherein
when a plurality of layers on the substrate are exposed, the controller calculates and stores a drift amount of an interlayer baseline before exposure, and
when a succeeding exposure is performed, the controller controls movement of the movement unit based on the drift amount of the baseline for each layer of the substrate and controls the exposure to be performed.

9. The maskless exposure apparatus according to claim 1, further comprising:
a light adjustment unit configured to adjust the spot beams projected by the projection unit, wherein
when the virtual mask and the substrate are misaligned, the controller calculates a drift amount of the baseline and controls light adjustment of the light adjustment unit based on the calculated, drift amount.

10. A maskless exposure method of forming a virtual mask pattern on a substrate, comprising:
dividing light output from a light source unit into a plurality of spot beams to form the virtual mask pattern and projecting the spot beams on the substrate;
outputting alignment light to align the substrate and a virtual mask;
capturing the alignment light and the spot beams projected to the substrate;
measuring distances between the alignment light and at least two of the spot beams based on the captured image to determine alignment between the virtual mask and the substrate and controlling movement of the substrate based on the determined alignment;
setting the distances between the alignment light and the spot beams as a baseline;
setting distances between a beam imaging position and at least two spot beams as a temporary baseline;
creating a vector $°r_{ij}'$ of the temporary baseline;
comparing the vector $°r_{ij}'$ of the temporary baseline with a vector $°r_{ij}$ of a standard baseline to calculate a drift amount of the temporary baseline;
calculating a drift amount of the set baseline based on the calculated drift amount of the temporary baseline; and
setting in advance distances between the alignment unit and at least two standard spot beams as a standard baseline and storing in advance a position $$°b_{ij} = \begin{bmatrix} X_{ij} \\ Y_{ij} \end{bmatrix}$$

of the standard baseline;
wherein the setting the distances between the alignment light and the spot beams as the baseline includes creating a vector $°b_{ij}'$ of the distances between the alignment light and the spot beams and setting the baseline $°B_{ij}'$ using the created vector $°b_{ij}'$ satisfying the condition $$°B_i' = \frac{1}{MN} \sum_{j=1}^{MN} °b_{ij}'$$

where, MN is M×N, which is the sampling number of spot beams, and j is a position of each of the spot beams.

11. The maskless exposure method according to claim 10, further comprising:
comparing the set baseline $°B_{ij}'$ with a standard baseline $°B_{ij}$ to compensate for an average positional drift amount of the set baseline.

12. The maskless exposure method according to claim 11, wherein determining the alignment between the virtual mask and the substrate comprises:
storing in advance a position of a target mark included in the virtual mask;
calculating a transfer amount of the target mark based on the position of the target mark and an average positional drift amount of the spot beams; and
compensating for a position of the substrate based on the transfer amount of the drift target mark when determining the alignment.

13. The maskless exposure method according to claim 10, further comprising:

$$°b_{ij} = \begin{bmatrix} X_{ij} \\ Y_{ij} \end{bmatrix}$$

calculating a drift position $$°b_{ij}' = \begin{bmatrix} X_{ij}' \\ Y_{ij}' \end{bmatrix}$$

of the baseline;
estimating translation (Tx, Ty), rotation (Rx, Ty), and magnification (Mx, My) coefficients using a multiple regression method satisfying the conditions $$\begin{bmatrix} T_X \\ M_X \\ -R_X \end{bmatrix} = \overline{\beta_x} = (U^T U)^{-1} U^T x', \begin{bmatrix} T_Y \\ M_Y \\ R_Y \end{bmatrix} = \overline{\beta_y} = (U^T U)^{-1} U^T y';$$

and
calculating a drift amount of the baseline using the estimated translation, rotation, and magnification coefficients.

14. The maskless exposure method according to claim 13, wherein determining alignment between the substrate and the virtual mask comprises:

storing in advance a position of a target mark included in the virtual mask;

calculating a transfer amount of the target mark based on the position of the target mark and drift amount of the baseline; and compensating for a position of the substrate based on the transfer amount of the drift target mark when determining the alignment.

15. The maskless exposure method according to claim 10, wherein determining alignment between the substrate and the virtual mask comprises:

calculating a drift amount of the baseline and controlling the movement of the substrate based on the calculated drift amount after determining that the virtual mask and the substrate are misaligned.

16. The maskless exposure method according to claim 15, wherein calculating the drift amount of the baseline comprises:

when a plurality of layers are exposed on the substrate, storing a drift amount of an interlayer baseline before exposure; and when a succeeding exposure is performed, controlling a movement of the substrate based on the drift amount of the baseline for each layer on the substrate.

17. The maskless exposure method according to claim 15, further comprising:

adjusting light projected on the substrate based on the calculated drift amount after determining that the virtual mask and the substrate are misaligned.

18. The maskless exposure apparatus according to claim 1, wherein the beam imaging unit is provided at one side of the movement unit to be horizontally opposite to the alignment unit with respect to the projection unit.

* * * * *